(12) United States Patent
Paek et al.

(10) Patent No.: US 10,910,575 B2
(45) Date of Patent: Feb. 2, 2021

(54) ELECTROLUMINESCENT DISPLAY DEVICE AND METHOD FOR MANUFACTURING THE SAME

(71) Applicant: LG Display Co., Ltd., Seoul (KR)

(72) Inventors: SeungHan Paek, Seoul (KR); Jeongwon Lee, Goyang-si (KR); Jonghoon Yeo, Goyang-si (KR); Jihoon Lee, Sungnam-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/403,372

(22) Filed: May 3, 2019

(65) Prior Publication Data

US 2019/0267563 A1 Aug. 29, 2019

Related U.S. Application Data

(63) Continuation of application No. 15/839,549, filed on Dec. 12, 2017, now Pat. No. 10,326,094.

(30) Foreign Application Priority Data

Dec. 28, 2016 (KR) ........................ 10-2016-0181418

(51) Int. Cl.
| | |
|---|---|
| *H01L 51/50* | (2006.01) |
| *C09K 11/06* | (2006.01) |
| *G09F 9/30* | (2006.01) |
| *H01L 27/32* | (2006.01) |
| *H01L 51/00* | (2006.01) |
| *H01L 51/52* | (2006.01) |

(52) U.S. Cl.
CPC .......... *H01L 51/5012* (2013.01); *C09K 11/06* (2013.01); *G09F 9/30* (2013.01); *H01L 27/3218* (2013.01); *H01L 27/3246* (2013.01); *H01L 27/3248* (2013.01); *H01L 27/3262* (2013.01); *H01L 51/0094* (2013.01); *H01L 51/5218* (2013.01)

(58) Field of Classification Search
CPC ............. H01L 51/5012; H01L 27/3248; H01L 51/0094; H01L 27/3246; H01L 27/3218; H01L 51/5218; H01L 27/3262; C09K 11/06; G09F 9/30
See application file for complete search history.

(56) References Cited

U.S. PATENT DOCUMENTS

| | | | | |
|---|---|---|---|---|
| 6,194,837 B1 ‡ | 2/2001 | Ozawa | ................ | G09G 3/3225 313/506 |
| 6,583,584 B2 ‡ | 6/2003 | Duineveld | .......... | H01L 27/3246 313/495 |

(Continued)

FOREIGN PATENT DOCUMENTS

| | | |
|---|---|---|
| CN | 1607876 A | 4/2005 |
| CN | 101740583 A | 6/2010 |

(Continued)

*Primary Examiner* — Donald L Raleigh
(74) *Attorney, Agent, or Firm* — Seed IP Law Group LLP

(57) ABSTRACT

Disclosed is an electroluminescent display device that may include a substrate, a first bank layer for defining a light-emission area on the substrate, a first electrode on the light-emission area of the substrate, and a light emitting layer on the first electrode, wherein an end of the first electrode faces an end of the first bank layer.

16 Claims, 9 Drawing Sheets

(56) References Cited

U.S. PATENT DOCUMENTS

| | | | |
|---|---|---|---|
| 6,762,552 B1 ‡ | 7/2004 | Duineveld | H01L 27/3283 313/504 |
| 7,993,540 B2 * | 8/2011 | Nishimura | H01L 21/67069 216/72 |
| 8,002,601 B2 ‡ | 8/2011 | Kitazume | H01L 27/3246 313/504 |
| 8,278,804 B2 ‡ | 10/2012 | Matsui | C09K 11/06 313/112 |
| 8,507,897 B2 ‡ | 8/2013 | Yanagihara | H01L 27/3246 257/40 |
| 8,679,875 B2 | 3/2014 | Yamagata et al. | |
| 10,714,695 B2 * | 7/2020 | Sim | H01L 51/0058 |
| 2005/0077816 A1 | 4/2005 | Yamada et al. | |
| 2006/0244369 A1 ‡ | 11/2006 | Eiichi | H01L 27/3246 313/504 |
| 2006/0273314 A1 * | 12/2006 | Lee | H01L 27/3246 257/59 |
| 2009/0146930 A1 | 6/2009 | Nishimura et al. | |
| 2010/0117079 A1 | 5/2010 | Miyairi et al. | |
| 2010/0123125 A1 | 5/2010 | Lee et al. | |
| 2012/0298984 A1 * | 11/2012 | Park | H01L 27/1225 257/43 |
| 2012/0326156 A1 * | 12/2012 | Choi | H01L 27/1259 257/71 |
| 2013/0038203 A1 ‡ | 2/2013 | Kim | H01L 51/5215 313/504 |
| 2013/0187132 A1 | 7/2013 | Ando et al. | |
| 2014/0120645 A1 | 5/2014 | Paek et al. | |
| 2014/0139102 A1 * | 5/2014 | Jeon | H05B 33/20 313/504 |
| 2014/0145158 A1 ‡ | 5/2014 | Choi | H01L 27/3246 257/40 |
| 2014/0147950 A1 | 5/2014 | Choi et al. | |
| 2014/0151651 A1 ‡ | 6/2014 | Jin | H01L 51/5209 257/40 |
| 2016/0043161 A1 * | 2/2016 | Miyazawa | H01L 27/3246 257/40 |
| 2016/0163769 A1 ‡ | 6/2016 | Lee | H01L 51/5209 257/40 |
| 2016/0172422 A1 * | 6/2016 | Kim | H01L 27/3262 257/40 |
| 2016/0351636 A1 | 12/2016 | Lee et al. | |
| 2018/0061874 A1 ‡ | 3/2018 | Sagawa | H01L 27/1463 |
| 2019/0115410 A1 | 4/2019 | Zhu et al. | |

FOREIGN PATENT DOCUMENTS

| | | | | |
|---|---|---|---|---|
| CN | 101740720 A | | 6/2010 | |
| CN | 103219356 A | | 7/2013 | |
| CN | 103840090 A | | 6/2014 | |
| CN | 105633124 A | | 6/2016 | |
| CN | 105870134 A | | 8/2016 | |
| CN | 106206646 A | | 12/2016 | |
| JP | 2005-222776 | ‡ | 8/2005 | |
| JP | 2005-222776 A | | 8/2005 | |
| JP | 2006-154169 | ‡ | 6/2006 | |
| JP | 2006-154169 A | | 6/2006 | |
| JP | 2006-260792 | ‡ | 9/2006 | |
| JP | 2006-260792 A | | 9/2006 | |
| JP | 2013-41828 | ‡ | 2/2013 | |
| JP | 2013-41828 A | | 2/2013 | |
| JP | 2013-105546 | ‡ | 5/2013 | |
| JP | 2013-105546 A | | 5/2013 | |
| JP | 2014-183024 | ‡ | 9/2014 | |
| JP | 2014-183024 A | | 9/2014 | |
| WO | WO-2007023272 A1 * | | 3/2007 | H01L 27/3283 |

\* cited by examiner

‡ imported from a related application

ELECTROLUMINESCENT DISPLAY DEVICE AND METHOD FOR MANUFACTURING THE SAME

CROSS REFERENCE TO RELATED APPLICATIONS

This application is a continuation of and claims priority from and the benefit of U.S. application Ser. No. 15/839,549, filed on Dec. 12, 2017, now pending, which claims priority from and the benefit of the Korean Patent Application No. 10-2016-0181418 filed on Dec. 28, 2016, which are hereby incorporated by reference as if fully set forth herein.

BACKGROUND

Technical Field

Embodiments of the present disclosure relate to an electroluminescent display device, and more particularly, to an electroluminescent display device manufactured by a solution process.

Description of the Related Art

An electroluminescent display device is provided in such way that an light emitting layer is formed between two electrodes. According as the light emitting layer emits light by an electric field between the two electrodes, an image is displayed on the electroluminescent display device.

The light emitting layer may be formed of an organic material which emits light when exciton is produced by a bond of electron and hole, and the exciton falls to a ground state from an excited state, or may be formed of an inorganic material such as quantum dot.

Hereinafter, a related art electroluminescent display device will be described with reference to the accompanying drawings.

FIG. 1 is a cross sectional view illustrating a related art electroluminescent display device.

As shown in FIG. 1, the related art electroluminescent display device may include a substrate 10, an electrode 20, a first bank layer 31, a second bank layer 32, and a light emitting layer 40.

The electrode 20 is provided on the substrate 10.

The first bank layer 31, which covers an end of the electrode 20, is provided on the substrate 10.

The second bank layer 32 is provided on the first bank layer 31. As a width of the second bank layer 32 is smaller than a width of the first bank layer 31, it is possible to realize a 2-step bank structure by the first bank layer 31 and the second bank layer 32, so that it is possible to improve spreadability of a solution at both sides of the light emitting layer 40, and to prevent the light emitting layer 40 from overflowing the second bank layer 32.

The light emitting layer 40 is provided on the electrode 20. The light emitting layer 40 may be formed by a solution process using an inkjet apparatus.

However, the related art electroluminescent display device has the following disadvantages.

In case of the related art, it is necessary to pattern the first bank layer 31 so as to realize the 2-step bank structure. In this case, a surface of the electrode 20 may be damaged by an etching solution or etching gas for patterning the first bank layer 31.

For example, if the first bank layer 31 is patterned by a wet etching process, a pin hole may be generated in the surface of the electrode 20 by the etching solution. Also, if the first bank layer 31 is patterned by a dry etching process, foreign matters such as fluorine (F) or sulfur (S) may be generated in the surface of the electrode 20 by the etching gas.

If the light emitting layer 40 is formed on the electrode 20 whose surface is damaged by the pin hole or the foreign matters, pollutants may be permeated into the light emitting layer 40 via the pin hole of the electrode 20, or the foreign matters may be permeated into the light emitting layer 40, to thereby shorten a lifespan of the electroluminescent display device.

BRIEF SUMMARY

Accordingly, embodiments of the present disclosure are directed to an electroluminescent display device that substantially obviates, among others, one or more problems due to limitations and disadvantages of the related art.

An aspect of embodiments of the present disclosure is directed to provide an electroluminescent display device which is capable of extending a lifespan by preventing an electrode from being damaged, and a method for manufacturing the same.

Additional advantages and features of embodiments of the disclosure will be set forth in part in the description which follows and in part will become apparent to those having ordinary skill in the art upon examination of the following or may be learned from practice of embodiments of the disclosure. The objectives and other advantages of embodiments of the disclosure may be realized and attained by the structure particularly pointed out in the written description and claims hereof as well as the appended drawings.

To achieve these and other advantages and in accordance with the purpose of embodiments of the disclosure, as embodied and broadly described herein, there is provided an electroluminescent display device that may include a substrate, a first bank layer for defining a light-emission area on the substrate, a first electrode on the light-emission area of the substrate, and a light emitting layer on the first electrode, wherein an end of the first electrode faces an end of the first bank layer.

In another aspect of an embodiment of the present disclosure, there is provided an electroluminescent display device that may include a substrate, a second electrode on the substrate, wherein some area of the second electrode is damaged, a light emitting layer on the second electrode, and a first electrode provided between the second electrode and the light emitting layer, wherein the first electrode prevents the damaged area of the second electrode from being in contact with the light emitting layer.

In another aspect of an embodiment of the present disclosure, there is provided a method for manufacturing an electroluminescent display device that may include forming a first bank layer on a substrate, and forming a photoresist pattern on the first bank layer, forming a light-emission area by removing some portion of the first bank layer under the condition that the photoresist pattern is used as a mask, forming a first electrode on the photoresist pattern and the light-emission area, removing the photoresist pattern and the first electrode provided on the photoresist pattern, and leaving the first electrode form on the light-emission area remain, and forming a light emitting layer on the first electrode that remains on the light-emission area.

It is to be understood that both the foregoing general description and the following detailed description of embodiments of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of embodiments of the disclosure and are incorporated in and constitute a part of this application, illustrate embodiment(s) of the disclosure and together with the description serve to explain the principle of embodiments of the disclosure. In the drawings.

DETAILED DESCRIPTION

Figure 1:
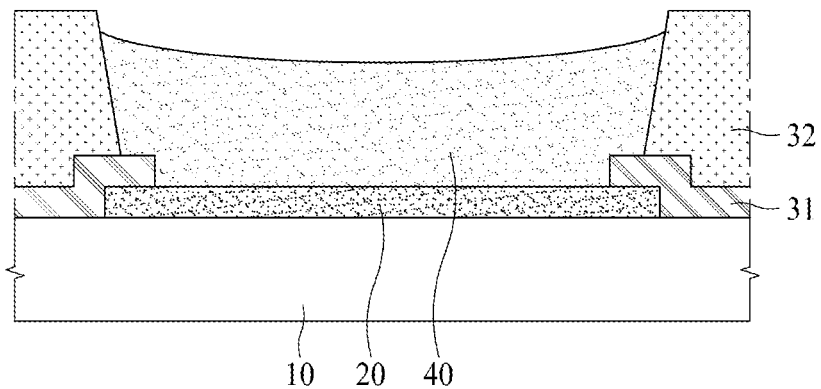
FIG. 1 is a cross sectional view illustrating a related art electroluminescent display device.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only' is used. The terms of a singular form may include plural forms unless referred to the contrary.

In construing an element, the element is construed as including an error region although there is no explicit description.

In describing a position relationship, for example, when the positional order is described as 'on~', 'above~', 'below~', and 'next~', a case which is not contact may be included unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an electroluminescent display device according to the embodiment of the present disclosure will be described with reference to the accompanying drawings.

Figure 2:
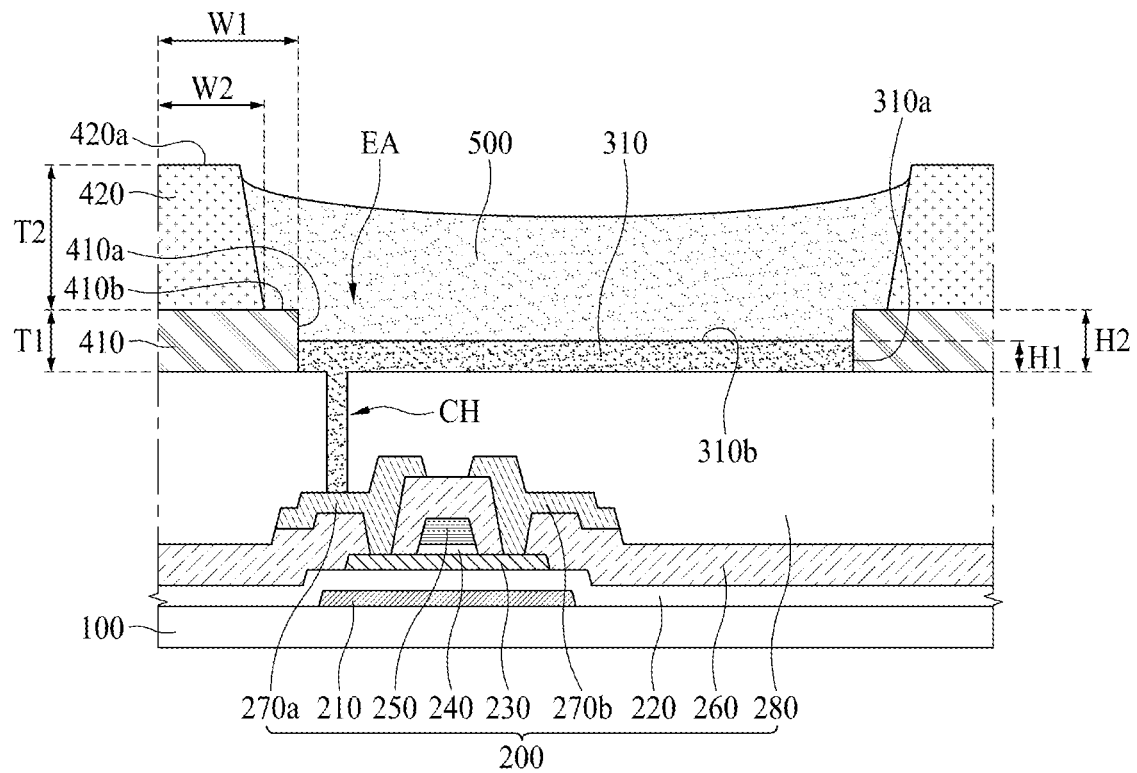
FIG. 2 is a cross sectional view illustrating an electroluminescent display device according to one embodiment of the present disclosure.

FIG. 2 is a cross sectional view illustrating an electroluminescent display device according to one embodiment of the present disclosure. The electroluminescent display device may be an organic light emitting device (OLED). FIG. 2 shows only one sub pixel.

As shown in FIG. 2, the electroluminescent display device according to one embodiment of the present disclosure may include a substrate 100, a circuit device layer 200, a first electrode 310, a first bank layer 410, a second bank layer 420, and a light emitting layer 500.

The substrate 100 may be formed of glass or transparent plastic, but not limited to these materials.

The circuit device layer 200 is formed on the substrate 100.

The circuit device layer 200 may include a light-shielding layer 210, a buffer layer 220, an active layer 230, a gate insulating film 240, a gate electrode 250, an insulating interlayer 260, a source electrode 270a, a drain electrode 270b, and a planarization layer 280.

The light-shielding layer 210 is formed on the substrate 100, to prevent light from being advanced to the active layer 230. Thus, the light-shielding layer 210 overlaps the active layer 230, and an area of the light-shielding layer 210 is larger than an area of the active layer 230.

The buffer layer 220 is formed on the light-shielding layer 210, to thereby insulate the light-shielding layer 210 and the active layer 230 from each other. Also, the buffer layer 220 prevents a material contained in the substrate 100 from spreading to an upper portion.

The active layer 230 is formed on the buffer layer 220. The active layer 230 may be formed of a silicon-based semiconductor material or an oxide-based semiconductor material, but not limited to these materials.

The gate insulating film 240 is formed on the active layer 230, to thereby insulate the active layer 230 and the gate electrode 250 from each other.

The gate electrode 250 is formed on the gate insulating film 240.

The insulating interlayer 260 is formed on the gate electrode 250, to thereby insulate the gate electrode 250 from the source/drain electrodes 270a/270b.

The source electrode 270a and the drain electrode 270b are provided on the insulating interlayer 260 and are provided at a predetermined interval from each other. The source electrode 270a and the drain electrode 270b are respectively connected with one end and the other end of the active layer 230 via contact holes provided in the insulating interlayer 260.

The planarization layer 280 is formed on the source electrode 270a and the drain electrode 270b, to thereby planarize a surface of the substrate 100.

The circuit device layer 200 may include a thin film transistor having the gate electrode 250, the active layer 230, the source electrode 270a, and the drain electrode 270b. FIG. 2 shows the thin film transistor with a top gate structure where the gate electrode 250 is provided on the active layer 230, but not limited to this structure. The circuit device layer 200 may include the thin film transistor with a bottom gate structure where the gate electrode 250 is provided below the active layer 230.

The circuit device layer 200 may include a switching thin film transistor, a driving thin film transistor, a sensing thin film transistor, and a capacitor. The thin film transistor shown in FIG. 2 corresponds to the driving thin film transistor as an illustrative example.

The thin film transistor and the capacitor included in the circuit device layer 200 may be formed below the light emitting layer 500, or may be formed below the bank layer 410 and 420. For example, in case of a top emission type of the electroluminescent display device according to the embodiment of the present disclosure, even though the thin film transistor and the capacitor are disposed below the light emitting layer 500, a light emission is not influenced by the thin film transistor and the capacitor, whereby the thin film transistor and the capacitor may be disposed below the light emitting layer 500. In case of a bottom emission type of the electroluminescent display device according to the embodiment of the present disclosure, if the thin film transistor and the capacitor are disposed below the light emitting layer 500, the light emission may be influenced by the thin film transistor and the capacitor, whereby the thin film transistor and the capacitor may be disposed below the bank layer 410 and 420.

The first electrode 310 is formed on the circuit device layer 200. In detail, the first electrode 310 is formed on a light-emission area (EA) defined by the first bank layer 410.

The first electrode 310 may function as an anode of the electroluminescent display device. If the electroluminescent display device according to the present disclosure is a bottom emission type, the first electrode 310 serves as a transparent electrode. Meanwhile, if the electroluminescent display device according to the present disclosure is a top emission type, the first electrode 310 serves as a reflective electrode.

The first electrode 310 may be electrically connected with the source electrode 270a of the circuit device layer 200 via contact hole (CH) provided in the planarization layer 280, but not limited to this structure. If needed, the first electrode 310 may be electrically connected with the drain electrode 270b of the circuit device layer 200 via contact hole (CH) provided in the planarization layer 280.

The first electrode 310 may be formed after a process of patterning the first bank layer 410. Accordingly, it is possible to prevent a surface of the first electrode 310 from being damaged by an etching solution or etching gas used for the process of patterning the first bank layer 410, which will be readily understood with the manufacturing process described herein.

The first electrode 310, which is formed after the process of patterning the first bank layer 410, may not overlap the first bank layer 410. Thus, an end 310a of the first electrode 310 is not covered by the first bank layer 410, whereby an entire upper surface 310b of the first electrode 310 does not overlap first bank layer 410 and may be in contact with the light emitting layer 500.

Also, the end 310a of the first electrode 310 may face an end 410a of the first bank layer 410. Especially, according to an embodiment, the end 310a of the first electrode 310 may be in contact with the end 410a of the first bank layer 410.

Also, a height H1 at the upper surface 310b of the first electrode 310 may be lower than a height H2 at an upper surface 410b of the first bank layer 410.

The first bank layer 410 is formed on the circuit device layer 200. The first bank layer 410 is patterned to define the light-emission area (EA) on the circuit device layer 200.

As described above, the first bank layer 410 does not overlap the first electrode 310. Also, a thickness of the first bank layer 410 is smaller than a thickness of the second bank layer 420, and a width of the first bank layer 410 is larger than a width of the second bank layer 420, whereby the end 410a of the first bank layer 410 is in contact with the light emitting layer 500.

The first bank layer 410 has the same hydrophilic properties as that of the light emitting layer 500. The first bank layer 410 having the hydrophilic properties may be formed of an inorganic insulating material such as silicon oxide. Accordingly, when coating a solution for the light emitting layer 500, it is possible to improve spreadability of the solution on the first bank layer 410.

The second bank layer 420 is formed on the first bank layer 410.

A width W2 of the second bank layer 420 is smaller than a width W1 of the first bank layer 410. That is, the second bank layer 420 defines a larger area than the first bank layer 410. The second bank layer 420 may be patterned by coating a mixture solution of an organic insulating material having the hydrophilic properties and a hydrophobic material such as fluorine (F), and carrying out a photolithography process. By light irradiated for the photolithography process, the hydrophobic material such as fluorine (F) may be transferred to an upper portion 420a of the second bank layer 420, whereby the upper portion 420a of the second bank layer 420 has the hydrophobic properties, and the remaining portions of the second bank layer 420 have the hydrophilic properties. That is, the portion of the second bank layer 420 being in contact with the first bank layer 410 has the hydrophilic properties, and the upper portion 420a of the second bank layer 420 has the hydrophobic properties, but not limited to this structure. For example, it is possible to provide the second bank layer 420 with an entire portion having the hydrophobic properties.

The spreadability of the solution for the light emitting layer 500 may be improved by the first bank layer 410 and the predetermined portions of the second bank layer 420 which have the hydrophilic properties. Especially, as the thickness T1 of the first bank layer 410 is smaller than the thickness T2 of the second bank layer 420, it is possible to realize a 2-step structure having the hydrophilic properties by the first bank layer 410 and the second bank layer 420, so that it is possible to improve spreadability of the solution for the light emitting layer 500 to an end of each sub pixel, and furthermore, it is possible to prevent the light emitting layer 500 from being upwardly rolled at the end of the sub pixel due to its large thickness.

Also, the upper portion 420a of the second bank layer 420, which has the hydrophobic properties, prevents the solution for the light emitting layer 500 from spreading to the adjoining sub pixels so that it is possible to prevent the light emitting layer 500 from being mixed together in the adjoining sub pixels.

Accordingly, the bank layers 410 and 420 may be provided along the boundaries between the adjoining sub pixels. Accordingly, it is possible to form an entire matrix configuration by the bank layers 410 and 420, and to prepare/define the light-emission area (EA) in each of the sub pixels by the use of bank layer 410 and 420.

The light emitting layer 500 is formed on the first electrode 310. The light emitting layer 500 is provided in the light-emission area (EA), but not provided over the upper portion 420a of the second bank layer 420, as described above.

The light emitting layer 500 may be provided to emit red light (R), green light (G), or blue light (B), but not limited to these colors.

The light emitting layer 500 may be formed by a solution process using an inkjet apparatus.

The light emitting layer 500 formed by the solution process may include at least one organic layer among a hole injecting layer, a hole transporting layer, an emitting layer, an electron transporting layer, and an electron injecting layer. If needed, the light emitting layer 500 may be formed of an inorganic material such as quantum dot.

For example, the light emitting layer 500 may be formed in a sequential deposition structure of the hole injecting layer, the hole transporting layer, the emitting layer, the electron transporting layer, and the electron injecting layer.

If needed, the light emitting layer 500 may be formed in a sequential deposition structure of the hole injecting layer, the hole transporting layer, and the emitting layer. In this case, the electron transporting layer and the electron injecting layer may be additionally deposited on the light emitting layer 500 by a deposition process such as evaporation. Although not shown, the electron transporting layer and the electron injecting layer, which are provided by the deposition process, are not individually patterned by each sub pixel, and the electron transporting layer and the electron injecting layer are provided not only on the light emitting layer 500 but also on the second bank layer 420.

Although not shown, a cathode may be additionally provided on the light emitting layer 500 and the second bank layer 420. If the electroluminescent display device according to the present disclosure is a top emission type, the cathode serves as a transparent electrode. Meanwhile, if the electroluminescent display device according to the present disclosure is a bottom emission type, the cathode serves as a reflective electrode.

According to one embodiment of the present disclosure, the first electrode 310 is formed after the process of patterning the first bank layer 410 so that it is possible to prevent the surface of the first electrode 310 from being damaged by the etching solution or etching gas used for the process of patterning the first bank layer 410, and furthermore, it is possible to extend a lifespan of the electroluminescent display device.

Figure 3:
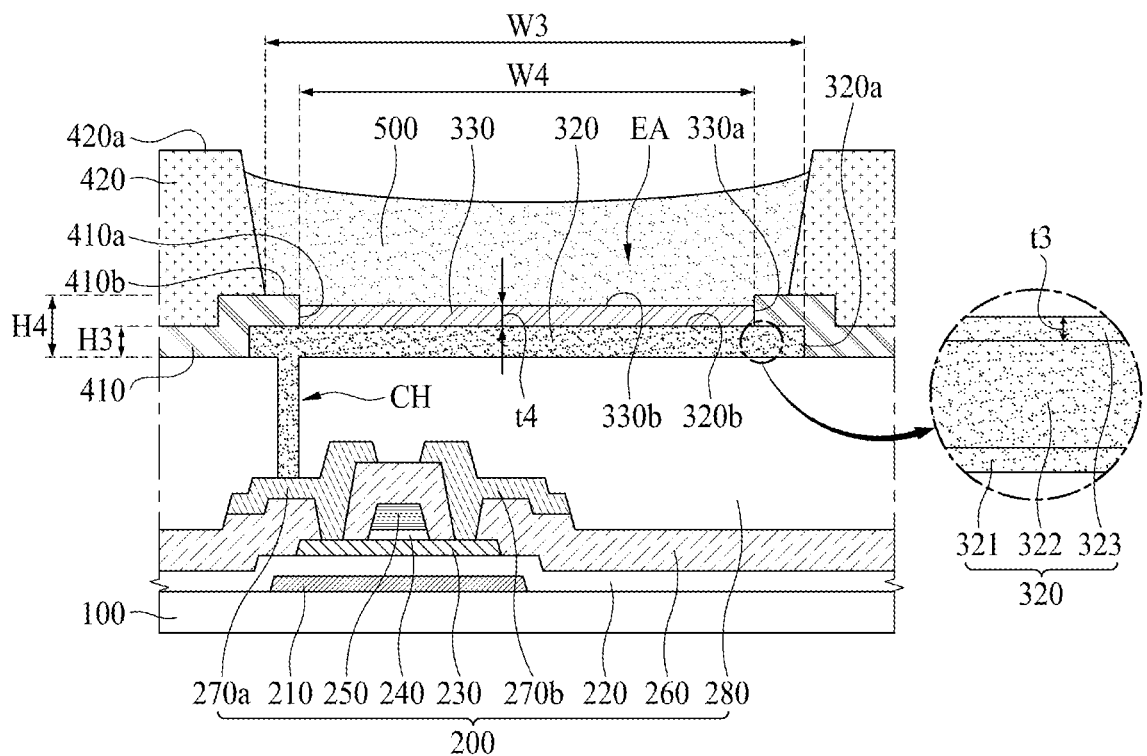
FIG. 3 is a cross sectional view illustrating an electroluminescent display device according to another embodiment of the present disclosure.

FIG. 3 is a cross sectional view illustrating an electroluminescent display device according to another embodiment of the present disclosure. FIG. 2 shows only one sub pixel.

As shown in FIG. 3, the electroluminescent display device according to another embodiment of the present disclosure may include a substrate 100, a circuit device layer 200, a first electrode 330, a second electrode 320, a first bank layer 410, a second bank layer 420, and a light emitting layer 500.

The substrate 100 and the circuit device layer 200 are identical in structure to those of the aforementioned embodiment of FIG. 2, whereby a detailed description for the substrate 100 and the circuit device layer 200 will be omitted.

The first electrode 330 and the second electrode 320 are formed on the circuit device layer 200. In detail, the second electrode 320 is formed on the circuit device layer 200, and the first electrode 330 is formed on the second electrode 320. That is, the second electrode 320 is formed below a lower surface of the first electrode 330.

The first electrode 330 and the second electrode 320 may function as an anode of the electroluminescent display device. Especially, in an embodiment, the first electrode 330 is formed of a transparent electrode, and the second electrode 320 is formed of a reflective electrode, to thereby realize a top emission type of the electroluminescent display device according to the embodiment of the present disclosure.

In detail, the first electrode 330 may be formed of Indium Tin Oxide (ITO), but not limited to this material. Also, the second electrode 320 may include a first transparent conductive layer 321, a reflective layer 322, and a second transparent conductive layer 323. The first transparent conductive layer 321 and the second transparent conductive layer 323 may be formed of Indium Tin Oxide (ITO), and the reflective layer 322 may be formed of argentums (Ag) alloy, but not limited to these materials.

The first electrode 330 may be electrically connected with the source electrode 270a or the drain electrode 270b of the circuit device layer 200 via the second electrode 320.

In the same manner as the aforementioned embodiment, an end 330a of the first electrode 330 is not covered by the first bank layer 410, and an entire upper surface 330b of the first electrode 330 is not covered by the first bank layer 410 and may be in contact with the light emitting layer 500. Also, the end 330a of the first electrode 330 faces an end 410a of the first bank layer 410. Specifically, the end 330a of the first electrode 330 may be in contact with the end 410a of the first bank layer 410. Also, a height H3 at the upper surface 330b of the first electrode 330 may be lower than a height H4 at an upper surface 410b of the first bank layer 410.

Unlike the first electrode 330, the second electrode 320 extends partially below the first bank layer 410. Accordingly, an end 320a of the second electrode 320 overlaps the first bank layer 410. Also, a width W3 of the second electrode 320 is larger than a width W4 of the first electrode 330.

The second electrode 320 may be electrically connected with the source electrode 270a of the circuit device layer 200 via a contact hole (CH) provided in the planarization layer 280, but not limited to this structure. For example, the second electrode 320 may be electrically connected with the drain electrode 270b of the circuit device layer 200 via a contact hole (CH) provided in the planarization layer 280.

The second electrode 320 may be formed before a process for patterning the first bank layer 410. Accordingly, a surface of the second electrode 320 may be damaged by an etching solution or etching gas used for the process of patterning the first bank layer 410.

In detail, a pin hole may be generated in a surface of the second transparent conductive layer 323 of the second electrode 320 by the etching solution, or foreign matters such as fluorine (F) or sulfur (S) may be generated in the surface of the second transparent conductive layer 323 of the second electrode 320 by the etching gas. In more detail, a predetermined portion of the second transparent conductive layer 323 with the pin hole or foreign matters corresponds to an area which is not covered by the first bank layer 410, that is, a light-emission area (EA), and the pin hole or foreign matters are not generated in the remaining portion of the second transparent conductive layer 323 which is covered by the first bank layer 410, which will be readily understood with the following manufacturing process.

Meanwhile, the first electrode 330 is formed on the surface of the second transparent conductive layer 323 provided with the pin hole or foreign matters. Thus, it is possible to prevent pollutants that remain in the surface of the second transparent conductive layer 323 from being permeated into the light emitting layer 500 by the use of first electrode 330.

Preferably, in order to prevent the permeation of pollutant, a thickness (t3) of the second transparent conductive layer 323 is smaller than a thickness (t4) of the first electrode 330. In order to obtain a micro cavity effect of the electroluminescent display device, the thickness (t4) of the first electrode 330 may be adjusted appropriately.

In the same manner as the aforementioned embodiment of FIG. 2, the first bank layer 410 is patterned so as to define the light-emission area (EA) on the circuit device layer 200. Also, the first bank layer 410 does not overlap the first electrode 330, but overlaps the second electrode 320. Also, a thickness of the first bank layer 410 is smaller than a thickness of the second bank layer 420, and a width of the first bank layer 410 is larger than a width of the second bank layer 420. Also, the first bank layer 410 has the same properties as that of the light emitting layer 500, that is, the hydrophilic properties.

The second bank layer 420 is patterned on the first bank layer 410. Herein, a material and structure of the second bank layer 420 is the same as that of the aforementioned embodiment of FIG. 2, whereby a detailed description for the second bank layer 420 will be omitted.

The light emitting layer 500 is formed on the light-emission area (EA) of the first electrode 330. Herein, a material and structure of the light emitting layer 500 is the same as that of the aforementioned embodiment of FIG. 2, whereby a detailed description for the light emitting layer 500 will be omitted.

Although not shown, a cathode may be additionally formed on the light emitting layer 500 and the second bank layer 420.

According to the embodiment of FIG. 3, the first electrode 330 is formed between the second electrode 320 and the light emitting layer 500. Thus, even though the surface of the second electrode 320 is damaged by the etching solution or etching gas used for the process of patterning the first bank layer 410, it is possible to prevent the damaged surface of the second electrode 320 from being in contact with the light emitting layer 500 by the use of first electrode 330, to thereby prevent the pollutant that remains in the damaged surface of the second electrode 320 from being permeated into the light emitting layer 500.

FIGS. 4A to 4G are cross sectional views illustrating an example method for manufacturing an electroluminescent display device according to one embodiment of the present disclosure, which relates to the method for manufacturing the electroluminescent display device shown in FIG. 2. Wherever possible, the same reference numbers will be used throughout the drawings to refer to the same or like parts, and a detailed description for the same parts will be omitted.

Figure 4A:
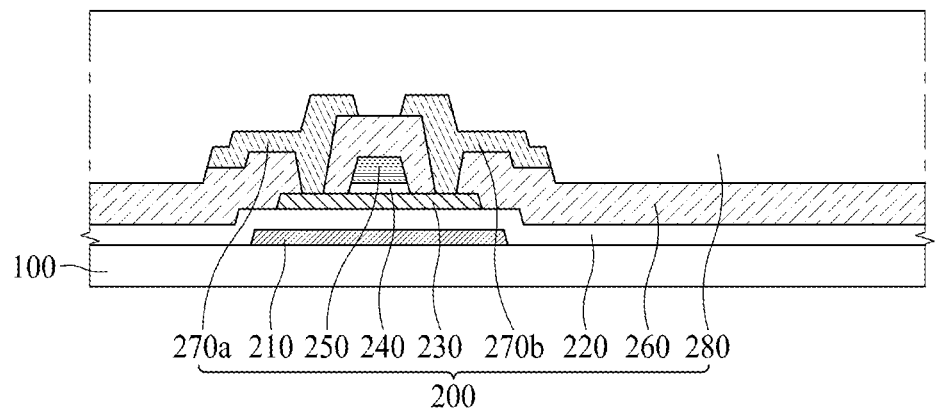
FIGS. 4A to 4G are cross sectional views illustrating a method for manufacturing an electroluminescent display device according to one embodiment of the present disclosure.

First, as shown in FIG. 4A, the circuit device layer 200 is formed on the substrate 100.

The circuit device layer 200 may be formed in various methods generally known to those in the art, and may be obtained by processes of forming the light-shielding layer 210, the buffer layer 220, the active layer 230, the gate insulating film 240, the gate electrode 250, the insulating interlayer 260, the source electrode 270a, the drain electrode 270b, and the planarization layer 280.

As described above, a detailed structure of the circuit device layer 200 may be changed in various ways, and the process for forming the circuit device layer 200 may be changed in various methods generally known to those in the art.

Figure 4B:
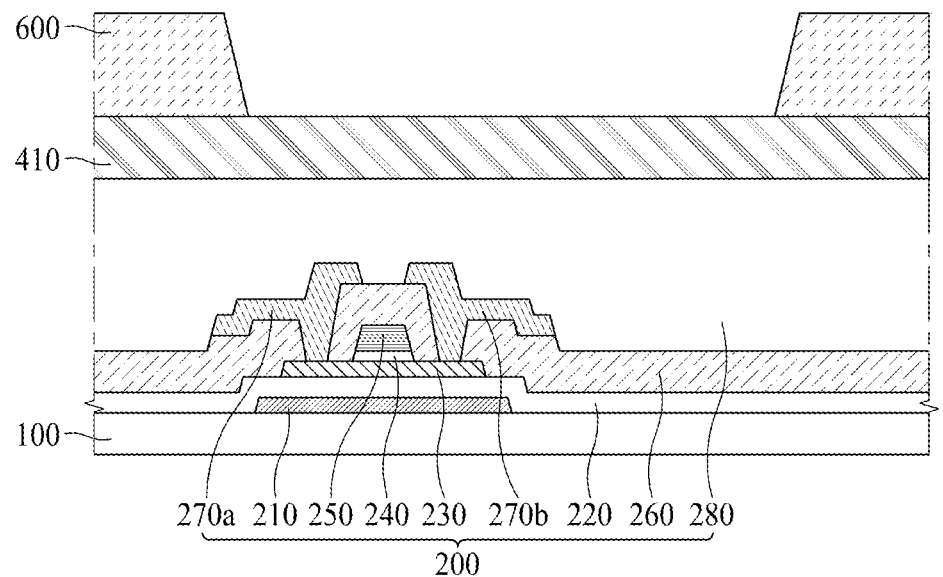

Then, as shown in FIG. 4B, the first bank layer 410 is formed on the circuit device layer 200, and a photoresist pattern 600 is formed on the first bank layer 410.

The first bank layer 410 is formed on an entire surface of the substrate 100.

Figure 4C:
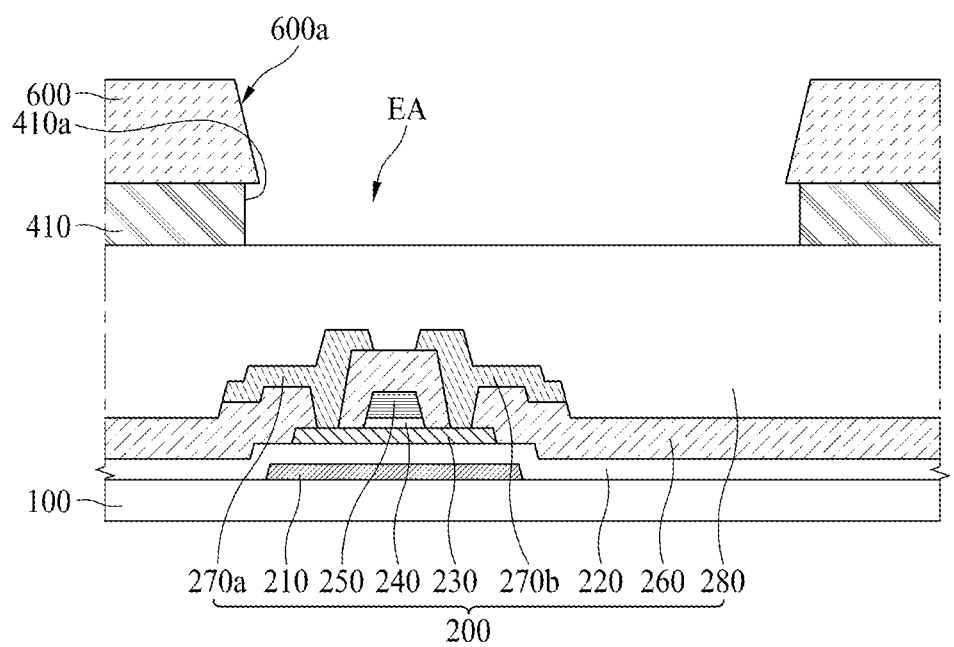

Then, as shown in FIG. 4C, the light-emission area (EA) is prepared/defined by removing some portion of the first bank layer 410 using the photoresist pattern 600 as a mask. The pattern of the first bank layer 410 is completed by the remaining portion of the first bank layer 410, which remains without being removed by the etching process.

If some portion of the first bank layer 410 is etched, the etching solution or etching gas may permeate into the space below an end 600a of the photoresist pattern 600, which might cause an undercut phenomenon. Accordingly, an end 410a of the first bank layer 410 which remains after the etching process, and the end 600a of the photoresist pattern 600 may be not in the same vertical line.

Figure 4D:
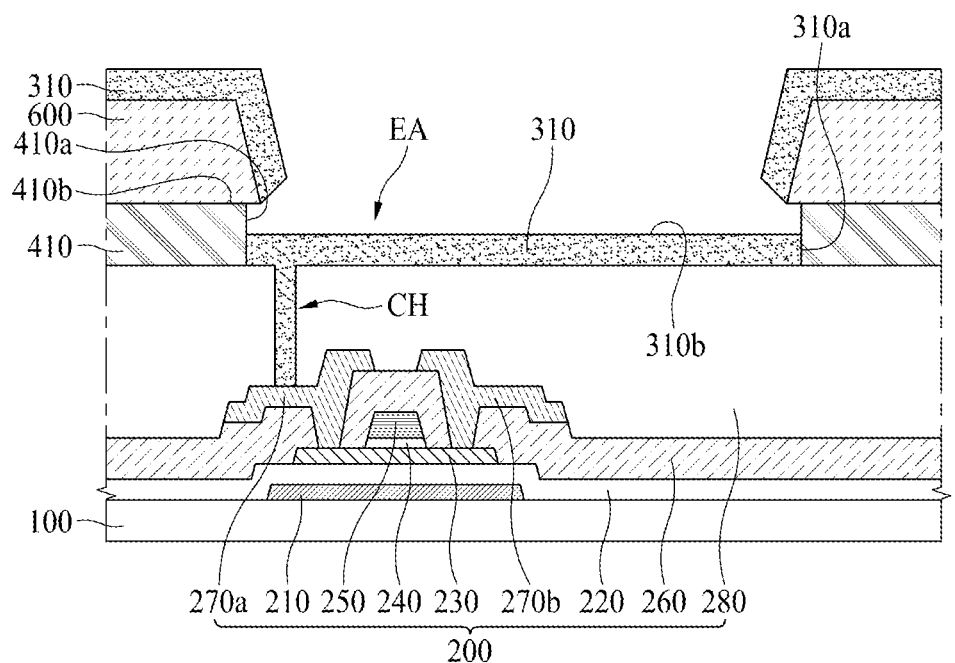

Then, as shown in FIG. 4D, the first electrode 310 is formed on the light-emission area (EA) prepared by removing some portion of the first bank layer 410. Some portion of the first electrode 310 is formed on the photoresist pattern 600, and the remaining portion of the first electrode 310 is formed on the circuit device layer 200.

Through the contact hole (CH) formed in the planarization layer 280, the first electrode 310 is connected with the source electrode 270a or the drain electrode 270b via the contact hole (CH).

In this case, the end 310a of the first electrode 310 is not covered by the first bank layer 410. The end 310a of the first electrode 310 may face the end 410a of the first bank layer 410, and more particularly, the end 310a of the first electrode 310 may be in contact with the end 410a of the first bank layer 410. Also, the height in the upper surface 310b of the first electrode 310 may be lower than the height in the upper surface 410b of the first bank layer 410.

Figure 4E:
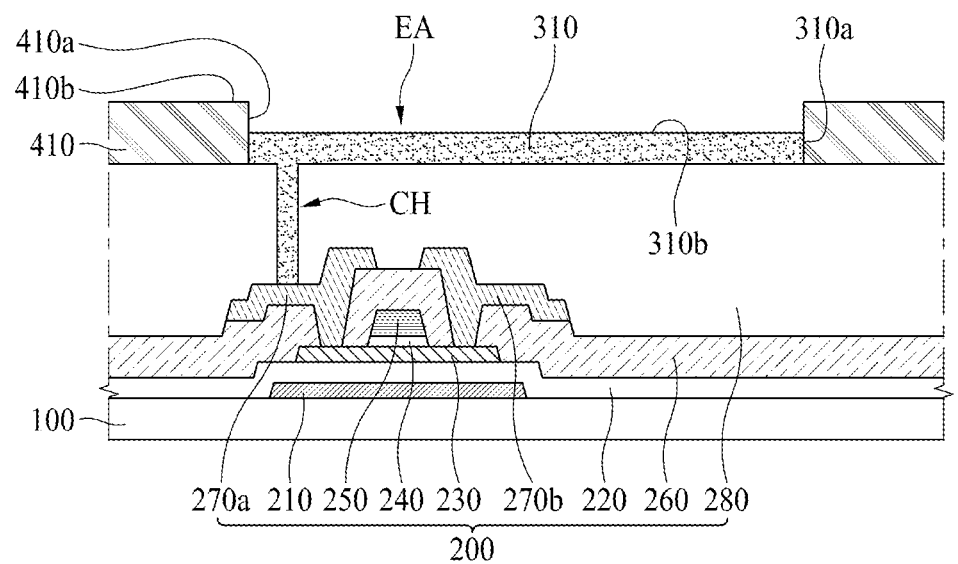

Then, as shown in FIG. 4E, the photoresist pattern 600 is removed, and the portion of the first electrode 310 provided on the photoresist pattern 600 is also removed, whereby the first electrode 310 remains in the light-emission area (EA).

For the aforementioned process of FIG. 4D, the height in the upper surface 310b of the first electrode 310 is lower than the height in the upper surface 410b of the first bank layer 410, whereby the etching solution permeates into the space below the end 600a of the photoresist pattern 600, to thereby remove the photoresist pattern 600 and the first electrode 310.

Figure 4F:
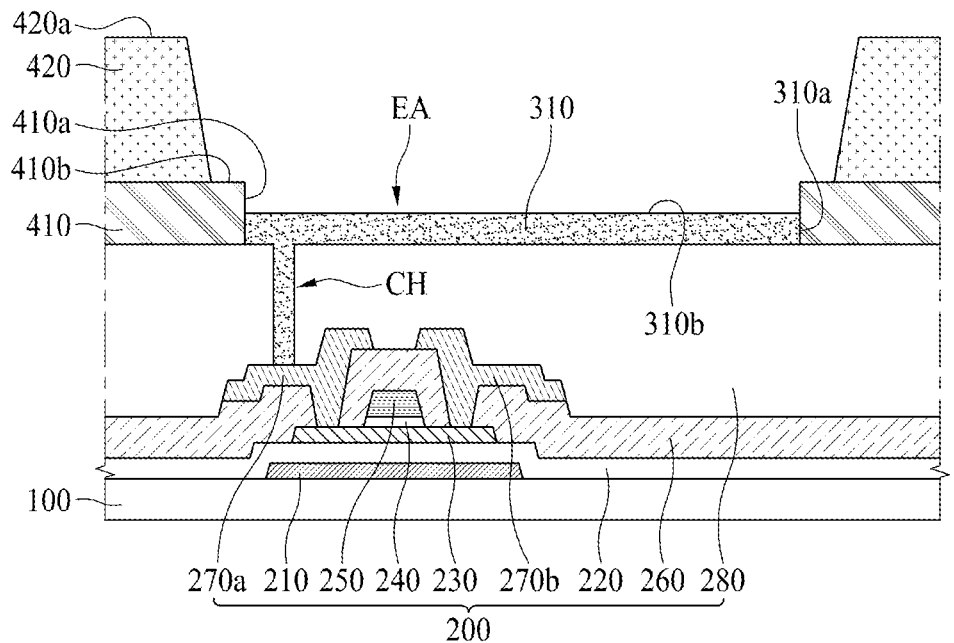

Then, as shown in FIG. 4F, the second bank layer 420 is formed on the first bank layer 410.

As described above, the width of the second bank layer 420 is smaller than the width of the first bank layer 410. The second bank layer 420 may be patterned by coating a mixture solution of an organic insulating material having the hydrophilic properties and a hydrophobic material such as fluorine (F), and carrying out a photolithography process. By light irradiated for the photolithography process, the hydrophobic material such as fluorine (F) may be transferred to the upper portion 420a of the second bank layer 420, whereby the upper portion 420a of the second bank layer 420 has the hydrophobic properties, and the remaining portions of the second bank layer 420 have the hydrophilic properties.

Figure 4G:
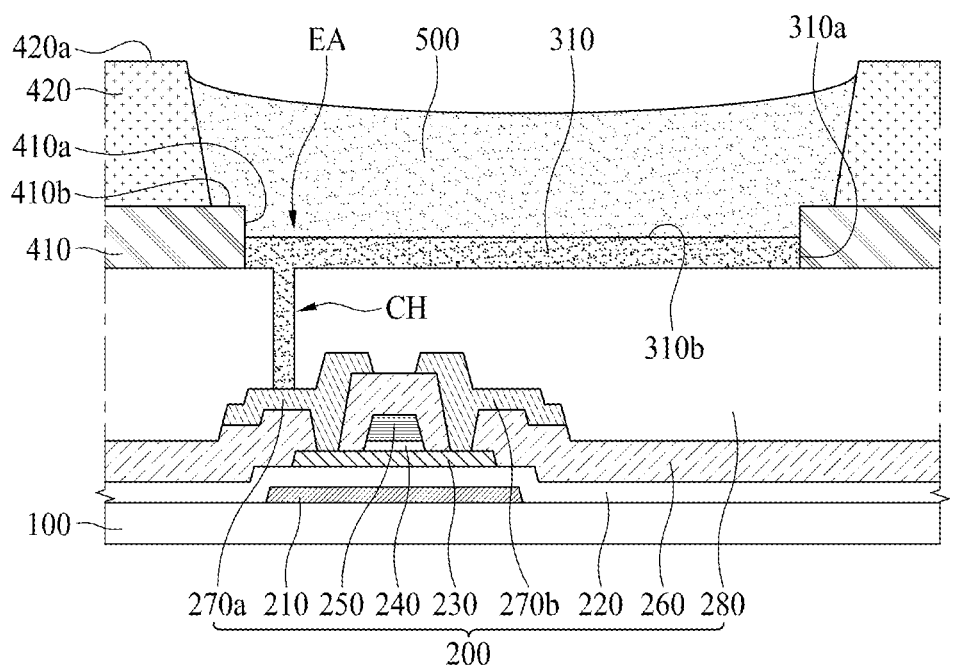

Then, as shown in FIG. 4G, the light emitting layer 500 is formed on the first electrode 310. The light emitting layer 500 is formed by a solution process using an inkjet apparatus. The light emitting layer 500 is not provided over the upper portion 420a of the second bank layer 420.

Meanwhile, although not shown, the cathode may be additionally formed on the light emitting layer 500 and the second bank layer 420.

According to one embodiment of the present disclosure, the first electrode 310 is formed after the process of patterning the first bank layer 410 so that it is possible to prevent the surface of the first electrode 310 from being damaged by the etching solution or etching gas used for the process of patterning the first bank layer 410.

According to one embodiment of the present disclosure, the first electrode 310 is patterned by the use of photoresist pattern 600 for patterning the first bank layer 410, whereby there is no need for an additional mask for the first electrode 310.

FIGS. 5A to 5G are cross sectional views illustrating an example method for manufacturing an electroluminescent display device according to another embodiment of the present disclosure, which relates to the method for manufacturing the electroluminescent display device shown in FIG. 3. Wherever possible, the same reference numbers will be used throughout the drawings to refer to the same or like parts, and a detailed description for the same parts will be omitted.

Figure 5A:
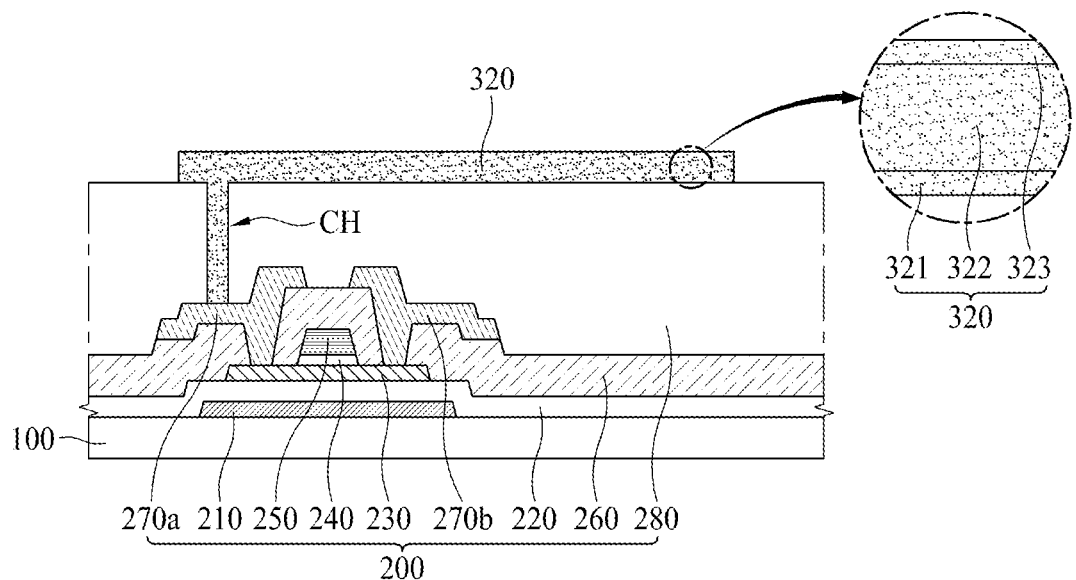
FIGS. 5A to 5G are cross sectional views illustrating a method for manufacturing an electroluminescent display device according to another embodiment of the present disclosure.

First, as shown in FIG. 5A, the circuit device layer 200 is formed on the substrate 100, and the second electrode 320 is formed on the circuit device layer 200.

The circuit device layer 200 may be formed in various methods generally known to those in the art, and may be obtained by processes of forming the light-shielding layer 210, the buffer layer 220, the active layer 230, the gate insulating film 240, the gate electrode 250, the insulating interlayer 260, the source electrode 270a, the drain electrode 270b, and the planarization layer 280 on the substrate 100.

As described above, a detailed structure of the circuit device layer 200 may be changed in various ways, and the process for forming the circuit device layer 200 may be changed in various methods generally known to those in the art.

Through the contact hole (CH) formed in the planarization layer 280, the second electrode 320 is connected with the source electrode 270a or the drain electrode 270b via the contact hole (CH).

The second electrode 320 may include the first transparent conductive layer 321, the reflective layer 322, and the second transparent conductive layer 323 sequentially provided on the planarization layer 280.

Figure 5B:
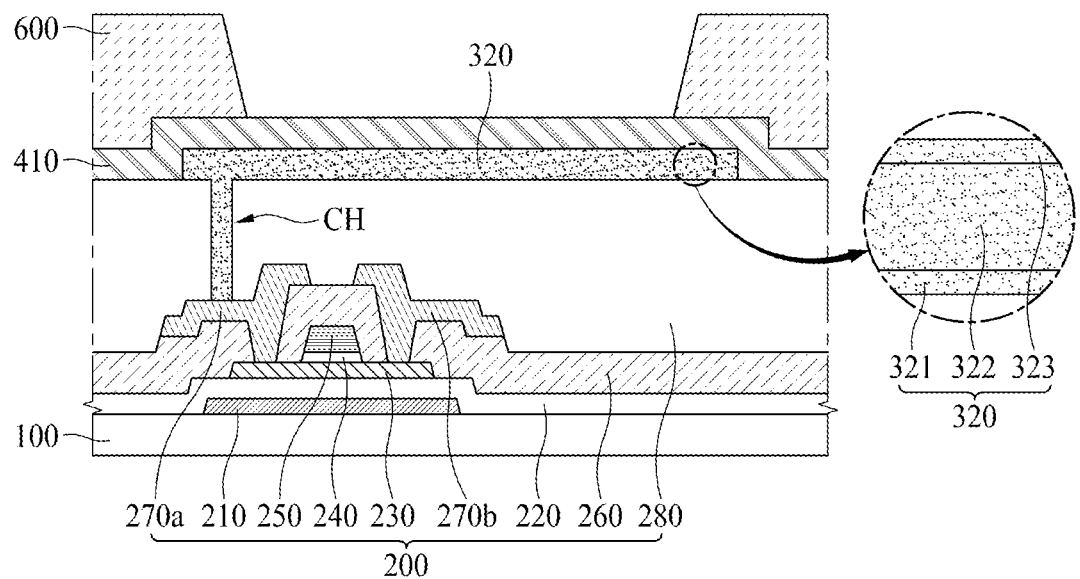

Then, as shown in FIG. 5B, the first bank layer 410 is formed on the circuit device layer 200 and the second electrode 320, and the photoresist pattern 600 is formed on the first bank layer 410.

The first bank layer 410 is formed on the entire surface of the substrate 100.

Figure 5C:
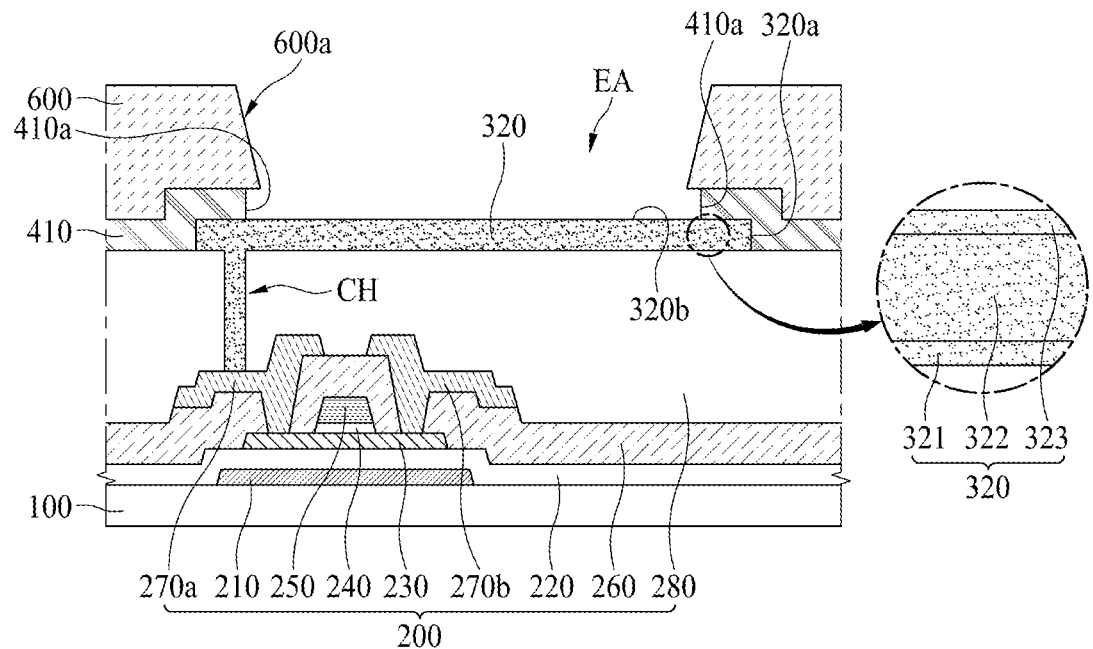

Then, as shown in FIG. 5C, the light-emission area (EA) is prepared/defined by removing some portion of the first bank layer 410 under the condition that the photoresist pattern 600 is used as a mask. The pattern of the first bank layer 410 is completed by the remaining portion of the first bank layer 410, which remains without being removed by the etching process. The end 320a of the second electrode 320 is covered by the remaining first bank layer 410.

Also, the second electrode 320 is exposed in the light-emission area (EA). In this case, the exposed surface of the second electrode 320 may be damaged by the etching solution or etching gas used for the process of removing some portion of the first bank layer 410.

For example, if some portion of the first bank layer 410 is removed by the wet etching process, the pin hole may be generated in the surface of the electrode 20 by the etching solution. Also, if the first bank layer 31 is patterned by the dry etching process, foreign matters such as fluorine (F) or sulfur (S) may be generated in the surface of the electrode 20 by the etching gas.

In this specification, the damage on some portion or surface of the second electrode 320 indicates the pin hole or foreign matters on some portion or surface of the second electrode 320.

Meanwhile, if etching some portion of the first bank layer 410, the etching solution or etching gas may permeate into the space below the end 600a of the photoresist pattern 600, which might cause an undercut phenomenon. Accordingly, the end 410a of the first bank layer 410 which remains after the etching process, and the end 600a of the photoresist pattern 600 may be not in the same vertical line.

Figure 5D:
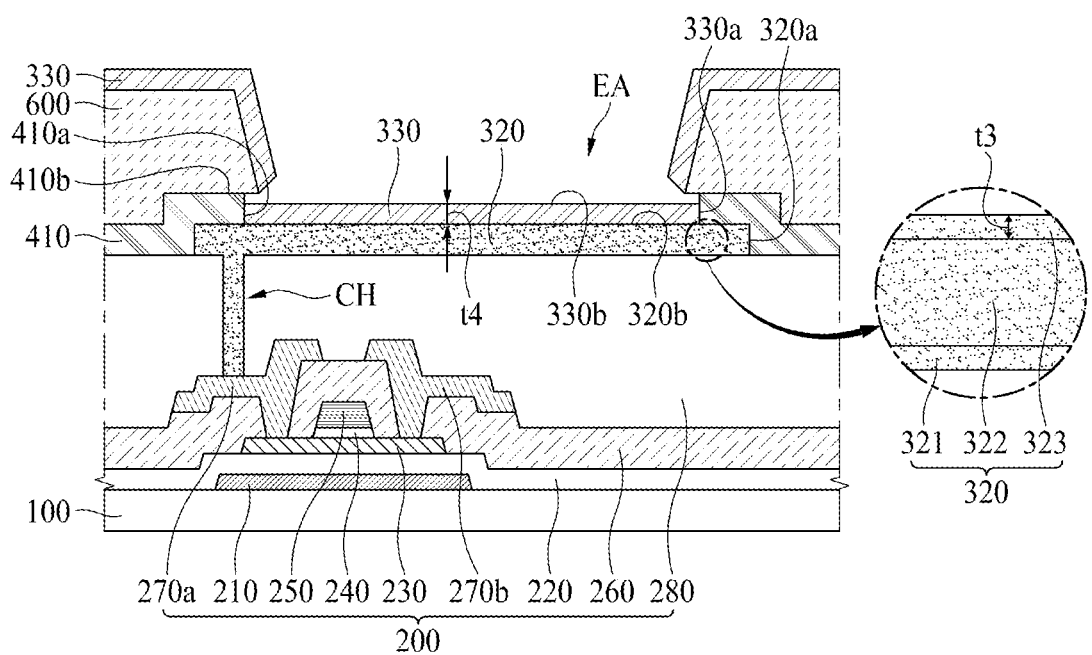

Then, as shown in FIG. 5D, the first electrode 330 is formed on the photoresist pattern 600 and the second electrode 320. Some portion of the first electrode 330 is formed on the photoresist pattern 600, and the remaining portion of the first electrode 330 is formed on the light emission area (EA) of the second electrode 320.

In this case, the end 330a of the first electrode 330 provided on the second electrode 320 is not covered by the first bank layer 410. The end 330a of the first electrode 330 may face the end 410a of the first bank layer 410, and more particularly, in an example, the end 330a of the first electrode 330 may be in contact with the end 410a of the first bank layer 410. Also, the height at the upper surface 330b of the first electrode 330 provided on the second electrode 320 may be lower than the height at the upper surface 410b of the first bank layer 410.

Figure 5E:
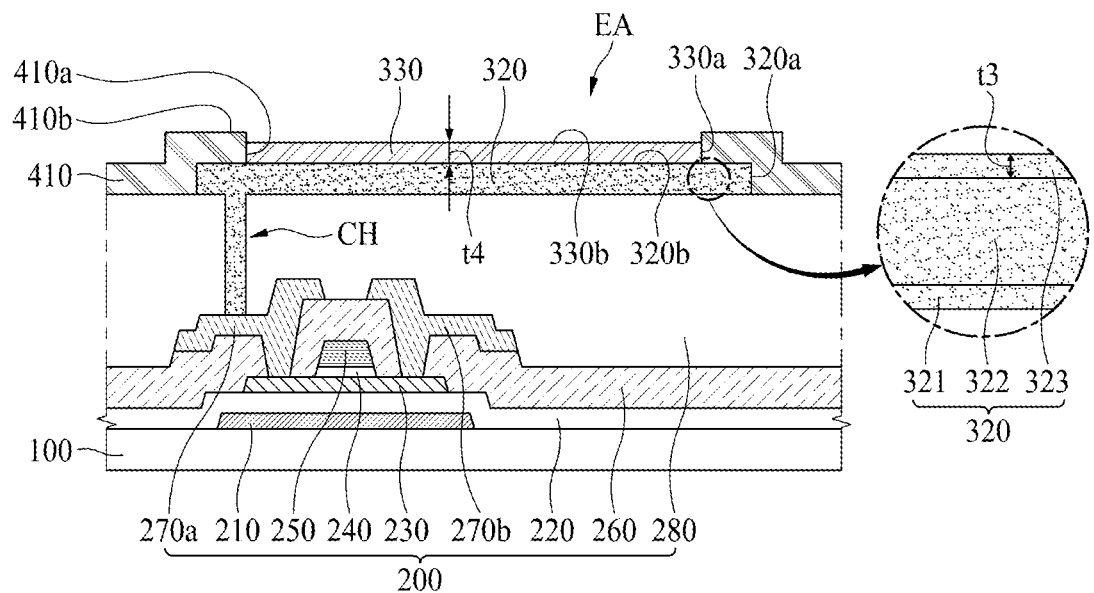

Then, as shown in FIG. 5E, the photoresist pattern 600 is removed, and the first electrode 330 provided on the photoresist pattern 600 is also removed, whereby the first electrode 330 remains on the light-emission area (EA) of the second electrode 320.

Figure 5F:
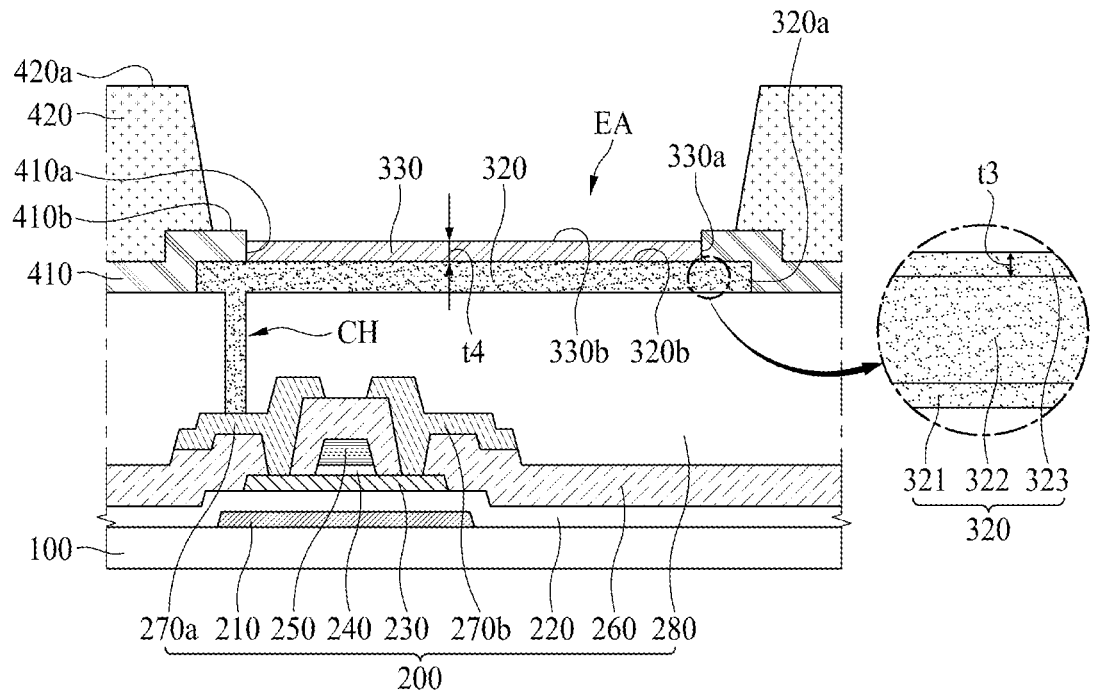

Then, as shown in FIG. 5F, the second bank layer 420 is formed on the first bank layer 410.

The process of forming the second bank layer 420 is the same as that of the aforementioned embodiment, whereby a detailed description for the process of forming the second bank layer 420 will be omitted.

Figure 5G:
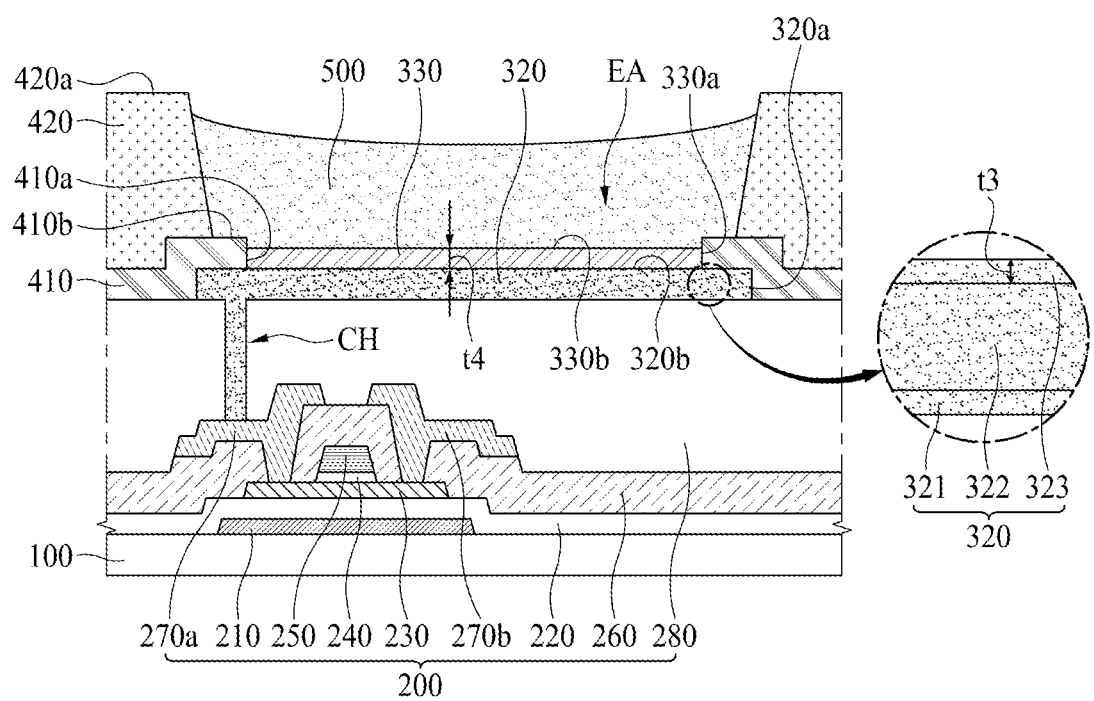

Then, as shown in FIG. 5G, the light emitting layer 500 is formed on the first electrode 330. The process of forming the light emitting layer 500 is the same as that of the aforementioned embodiment, whereby a detailed description for the process of forming the light emitting layer 500 will be omitted.

Meanwhile, although not shown, the cathode may be additionally formed on the light emitting layer 500 and the second bank layer 420.

According to one embodiment of the present disclosure, the first electrode 330 is formed after the process of patterning the first bank layer 410 so that it is possible to prevent the surface of the first electrode 330 from being damaged by the etching solution or etching gas used for the process of patterning the first bank layer 410.

According to one embodiment of the present disclosure, the first electrode 330 is patterned by the use of photoresist pattern 600 for patterning the first bank layer 410, whereby there is no need for the additional mask for the first electrode 330.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed:

1. An electroluminescent display device comprising:
   a substrate;
   an anode electrode on the substrate, the anode electrode having:
      a second electrode on the substrate, the second electrode including a first transparent conductive layer, a second transparent conductive layer, and a reflective layer, and the reflective layer interposed between the first transparent conductive layer and the second transparent conductive layer; and
      a first electrode on and in direct contact with the second transparent conductive layer of the second electrode;
         a first bank layer defining a light-emission area on the substrate, the first bank layer having a hydrophilic property;
         a second bank layer on a first portion of an upper surface of the first bank layer, an upper portion of the second bank layer having a hydrophobic property and a lower portion of the second bank layer having the hydrophilic property; and
      a light emitting layer including an organic layer on the first electrode, the light emitting layer covering an inside surface and a second portion of an upper surface of the first bank layer and partially covering an inside surface of the second bank layer, the second portion of the upper surface of the first bank layer being exposed from the second bank layer and the inside surface of the first bank layer being exposed from an upper surface of the first electrode;
   wherein the inside surface of the first bank layer is stiffer than the inside surface of the second bank layer,
   wherein a thickness of the first electrode is thicker than a thickness of the second transparent conductive layer of the second electrode.

2. The electroluminescent display device according to claim 1, wherein the second electrode includes a pin hole.

3. The electroluminescent display device according to claim 1, wherein the second electrode includes a foreign matter other than a material of the second electrode.

4. The electroluminescent display device according to claim 3, wherein the foreign matter includes at least one of a fluorine or a sulfur.

5. The electroluminescent display device according to claim 1, wherein the second bank layer includes a different material from that of the first bank layer.

6. The electroluminescent display device according to claim 1, wherein the light emitting layer substantially covers all of the inside surface and all of the second portion of the upper surface of the first bank uncovered by the second bank layer.

7. The electroluminescent display device according to claim 1, wherein the light emitting layer being contained by the second bank layer.

8. The electroluminescent display device according to claim 1, wherein the second transparent conductive layer of the second electrode is in contact with the lower surface of the first electrode.

9. The electroluminescent display device according to claim 1, wherein the first bank laterally extends from the second bank layer into the light-emission area.

10. The electroluminescent display device according to claim 1, wherein the second bank layer defines a wider open area than the first bank layer does.

11. The electroluminescent display device according to claim 1, wherein an entire upper surface of the first electrode is in contact with the light emitting layer.

12. The electroluminescent display device according to claim 1, wherein the first bank layer includes a same hydrophilic property as the light emitting layer.

13. The electroluminescent display device according to claim 1, wherein a height at an upper surface of the first electrode is lower than a height at the upper surface of the first bank layer.

14. The electroluminescent display device according to claim 1, wherein an end of the second electrode overlaps the first bank layer.

15. The electroluminescent display device according to claim 1, wherein the first bank layer is formed of a hydrophilic material, and the upper portion of the second bank layer is formed of a hydrophobic material.

16. The electroluminescent display device according to claim 1, wherein the inside surface of the first bank layer is contacted with a side surface of the first electrode.

* * * * *